United States Patent [19]

Precht et al.

[11] Patent Number: 5,043,773
[45] Date of Patent: Aug. 27, 1991

[54] WAFER BASE FOR SILICON CARBIDE SEMICONDUCTOR DEVICES, INCORPORATING ALLOY SUBSTRATES

[75] Inventors: Walter Precht, Towson, Md.; Richard Koba, Burlington, Mass.; Donald Kupp, State College, Pa.; Delwyn Cummings, Meriden, Conn.

[73] Assignee: Advanced Technology Materials, Inc., Danbury, Conn.

[21] Appl. No.: 532,906

[22] Filed: Jun. 4, 1990

[51] Int. Cl.[5] ............................................ H01L 29/161
[52] U.S. Cl. ........................................ 357/16; 357/60; 357/61; 357/4; 437/100
[58] Field of Search .................... 357/60, 61, 16, 4; 437/100

[56] References Cited

U.S. PATENT DOCUMENTS

| | | | |
|---|---|---|---|
| 3,661,599 | 5/1972 | Hollox et al. | 106/43 |
| 4,568,792 | 2/1986 | Mooney et al. | 136/260 |
| 4,616,672 | 9/1986 | Addamiano | 427/249 |
| 4,697,202 | 9/1987 | Sher | 357/63 |
| 4,738,937 | 4/1988 | Parsons | 437/180 |
| 4,767,666 | 8/1988 | Bunshah et al. | 428/334 |
| 4,916,088 | 4/1990 | Mooney et al. | 437/81 |
| 4,923,716 | 5/1990 | Brown et al. | 427/249 |

FOREIGN PATENT DOCUMENTS

WO/06438  7/1989  World Int. Prop. O.

OTHER PUBLICATIONS

"Critical Evaluation of the Status of the Areas of Future Research Regarding the Wide Band Gap Semiconductors Diamond, Gallium, Nitride and Silicon Carbide", Davis et al., Materials Science and Eng. B1 (1988), pp. 77–104.
"Microwave and Millimeter Wave Power Generation in Silicon Carbide Avalanche Devices", Mehdi, Haddad and Mains, J. Appl. Phys. 64, 1533 (1988).
Temperature Dependence of the Current–Voltage Characteristics of Metal–Semiconductor Field–Effect Transistors in N-Type B-SiC Grown via Chemical Vapor Deposition, H. S. Kong et al., Appl. Phys. Lett. 51, 442 (1987).
A Floating Zone Technique for the Growth of Carbide Single Crystals, Precht, W. Hollox, G. E., Technical Report 68-9c, NTIS Order No. AD 671 639.
"Synthesis and Study of Epitaxial Layers of $(SiC)_{1-x}$-$(AlN)_x$ Wide–Gap Solid Solutions", Nurmagomedov et al., Sov. Tech. Phys. Lett. 12(9), p. 431 (1987).
CRC Handbook, 63rd Edition, pp. D-40 through D-44.

Primary Examiner—William Mintel
Assistant Examiner—Roy Potter
Attorney, Agent, or Firm—Janet R. Elliott

[57] ABSTRACT

A semiconductor wafer base is disclosed which is suitable for fabrication of devices in silicon carbide, comprising a single crystal substrate which is a transition metal carbide alloy having cubic crystal structure and an unpolytyped, single crystal 3C-silicon carbide overlay epitaxially related to the substrate. Preferably, the substrate is an alloy of two or more of titanium carbide, tantalum carbide, vanadium carbide, and niobium carbide, with alttice parameter differing from 3C-silicon carbide by less than about 1%. Use of the transition metal carbide alloys enables the preparation of large, single crystal substrates free from cracks, dislocations, or other defects, suitable for epitaxial deposition of 3C-silicon carbide. The 3C-silicon carbide epitaxial overlay may be deposited by any suitable technique, including chemical vapor deposition and reactive evaporation, and may be doped with n- or p-type dopants. The 3C-silicon carbide is useful for fabricating semiconductor devices for use at high temperatures, high powers, and in corrosive environments.

9 Claims, 3 Drawing Sheets

WAFER BASE FOR SILICON CARBIDE SEMICONDUCTOR DEVICES, INCORPORATING ALLOY SUBSTRATES

BACKGROUND OF THE INVENTION

1. Field of the Invention

The present invention relates to semiconductor devices and methods of forming same and more particularly to a semiconductor device wafer base wherein a silicon carbide overlay is deposited on a suitable substrate.

2. Description of the Related Art

An extensive technology of semiconductor devices has been developed based upon the properties of single crystal silicon and other similar materials which may be doped, heat treated, and otherwise processed to produce adjacent layers and regions of varying electronic characteristics. The use of devices produced by silicon technology is generally limited to operation at ambient or, at most, moderately elevated temperatures and in non-corrosive, inert atmospheres. The temperature limitation is a consequence of the intrinsic behavior of silicon at high temperatures and of the rapid diffusion of dopants or impurity species, which in turn can substantially alter the character of the fabricated semiconductor device. The limitation to relatively inert environments results from the high chemical reactivity of silicon in many corrosive environments, which also can alter the character of the fabricated device. Silicon devices are also limited as to power level, frequency, and radiation tolerance by the materials used therein.

For some applications, the temperature, environmental, and other use limitations on silicon devices may be overcome by the use of proper cooling and packaging techniques. In other applications, these limitations have prevented the use of silicon for integrated circuit technology. For example, in many spacecraft and aircraft applications, elevated temperatures are encountered, and it is not always possible to insure that adequate cooling will be provided. In high power applications, internal thermal transients in devices otherwise operating at ambient temperature can rapidly destroy the operability of the device unless extensive cooling is provided. Such cooling requires that the device be larger in size that might otherwise be necessary, in part defeating the purpose of the integrated circuit technology.

There has therefore been an ongoing, but as yet not fully successful, search over a period of twenty years to identify and develop a semiconductor technology based in other materials. Such a technology would desirably allow the fabrication of devices for use at higher temperatures such as, for example, the range of at least about 400° C. to 600° C., and in applications not amenable to the use of silicon. Because corrosive effects can be greatly accelerated at elevated temperatures and pressures, any such materials and devices must also exhibit excellent corrosion resistance at the elevated use temperatures and over a range of pressures from vacuum to many atmospheres. Some generally desirable characteristics of such materials have been identified, including large band gap, good electrical conductivity, high breakdown electric field, low dielectric constant, ability to be doped to produce regions of varying electronic characteristics, a high melting temperature, good strength at operating temperatures, resistance to diffusion by undesired foreign atoms, good thermal conductivity, thermal stability, chemical inertness, and the ability to form ohmic external contacts.

Silicon carbide is a candidate material that can meet the requirements enumerated above. SiC is the only compound species that exists in the Si-C system, but it can occur in many crystalline polytypes. The lone cubic polytype is referred to as 3C-silicon carbide, or also as beta-SiC or $\beta$-SiC. 3C-SiC crystallizes in the zincblende structure. About 170 hexagonal and rhombohedral polytypes are known, which are referred to collectively as "alpha-SiC." The most common is 6H, which has a hexagonal crystal structure.

3C-SiC has many properties superior to silicon and to gallium arsenide. Among the desirable properties of 3C-SiC are high breakdown voltage, a relatively large bandgap (2.3 eV at ambient temperature) and thermal conductivity over three times higher than that of silicon at ambient temperature. 3C-SiC is resistant to the diffusion of impurity species and may be processed by several techniques similar to those used in silicon device technology. The high thermal conductivity and high breakdown field obtainable for 3C-SiC predict that integration of high density devices can be achieved in this material.

Two figures of merit that are particularly relevant to the potential applications of 3C-SiC have been devised to compare semiconductor materials. Keyes Figure of Merit compares semiconductor materials on the basis of switching speeds that could in principle be obtained with transistors fabricated in the material. In this case a high limiting velocity allows high speed devices. Small, closely spaced devices have a high density of power dissipation (heat production). The heat flows from the device by conduction through the semiconductor material thereby encountering a thermal resistance that is inversely proportional to the size of the device. A lower limit is set on the device size by the maximum permissible thermal resistance and, thus, a high thermal conductivity $\sigma_T$ is greatly desirable in the device material. Keyes figure of merit is $\sigma_T(V_{sat}/K)^{\frac{1}{2}}$ where K is the dielectric constant of the material. Johnson's Figure of Merit compares semiconductor materials on basis of high frequency and high power capabilities for discrete devices. The basic limitation on various transistor characteristics is set by the product of the breakdown electric field $E_B$ and the saturated electron velocity $V_{sat}$, i.e. the velocity at which an electron has sufficient energy to emit an optical photon. Johnson's figure of merit is $(E_B V_{sat}/\pi)^2$. A comparison of Johnson's and Key's figures of merit for various semiconductor materials vs. silicon (from "Critical Evaluation of the Status of the Areas for Future Research Regarding the Wide Band Gap Semiconductors Diamond, Gallium Nitride and Silicon Carbide," Davis et al., *Materials Science and Engineering*, B1 (1988), pp. 77-104) shows the potential usefulness of 3C-SiC for high temperature, high power semiconductor devices:

| Material | Johnson's Figure of Merit (ratio to Si) | Keyes' Figure of Merit (ratio to Si) |
| --- | --- | --- |
| Silicon | 1.0 | 1.0 |
| GaAs | 6.9 | 0.456 |
| InP | 16.0 | 0.608 |
| GaN | 281.6 | 1.76 |
| 6H-SiC | 695.4 | 5.12 |
| 3C-SiC | 1137.8 | 5.8 |

Mehdi, Haddad and Mains have performed an numerical simulation analysis that shows that 3C-SiC may be especially useful for high frequency, high power devices such as impact avalanche transit-time (IMPATT) diodes (J. Appl. Phys. 64, 1533(1988)). 3C-SiC devices theoretically can produce significantly higher powers than Si and GaAs devices at comparable frequencies.

An additional advantage of 3C-SiC is that many device processing steps that have been developed for Si may be used with very little modification. Among the 3C-SiC similarities to Si that are relevant to device processing are: 3C-SiC has a shallow donor dopant (N) which can be incorporated controllably during epitaxial growth or by ion implantation; 3C-SiC has a shallow acceptor dopant (Al) which can be incorporated controllably during epitaxial growth or by ion implantation; it is possible to grow thermal $SiO_2$ with good electrical properties (prototype 3C-SiC MOSFETs operating at 650° C. have been fabricated; see Davis et al. referenced above); 3C-SiC is not etched by HF; 3C-SiC can withstand temperatures up to 1550° C. during homo- or heteroepitaxial growth. Silicon carbide may thus be processed by several techniques similar to those used in silicon device technology, and in many instances silicon carbide devices may be substituted at moderate and low temperatures for silicon devices. Silicon carbide semiconductor device technology therefore offers the opportunity for supplementing, and in some instances replacing, conventional silicon device technology.

The chief obstacle to the production of 3C-SiC devices has been the difficulty of producing unpolytyped SiC single crystals of sufficient size to allow fabrication of devices. SiC does not melt congruently; 3C-SiC converts to an alpha polytype above 1600° C. and dissociates at 2830° C. under 35 atmospheres of argon.

Small bulk crystals of 3C-SiC have been made, ~2 mm×2 mm. These small crystals showed that devices would indeed be extremely useful but not big enough realistically to fabricate device arrays as is done with silicon. Therefore although device potential has been demonstrated on a very small scale, there have been no demonstrations of devices on a large enough scale to be useful. Small scale devices fabricated from vapor-grown SiC crystals included uv flame detectors, grown junction diode rectifiers, and thermistors.

An alternative to growing bulk crystals and fabricating devices by homoepitaxy is preparation of wafer bases by heteroepitaxially depositing an overlay onto a foreign substrate. A high quality, single crystal substrate with a good lattice match is required for the success of this approach. Previous efforts tried this approach using 3C-SiC single crystal substrates, but large 3C-SiC single crystals have not been prepared without included alpha polytypes. The 3C-SiC overlay carried the defects forward. Silicon substrates have been tried, but the coefficient of thermal expansion of silicon is about 8% different and lattice parameters differ by 20%. Lattice mismatch results in formation of numerous microtwins, intrinsic stacking faults and antiphase boundaries (APBs). Use of the <100> silicon surface, slightly off-axis, reduces the number of APBs but does not completely eliminate them. Unfortunately other types of defects are not eliminated by this procedure. Carburization of the silicon surface has been tried in an only partially successful attempt to ameliorate these problems. 6H-SiC, with its hexagonal crystal structure, also has proven unsuitable as a substrate, because APBs are formed when it is attempted to form epitaxial overlays of 3C-SiC (for example, see H. S. Kong, J. W. Palmour, J. T. Glass and R. F. Davis, Appl. Phys. Lett., 51,442 (1987)). Stacking faults typically emanate from these APBs. APBs and the resulting stacking faults degrade semiconductor performance, causing high parasitic resistances that would prevent high frequency operation of semiconductor devices. Alpha SiC has many polytypes, and inhomogeneous polytypes will lead to inhomogeneous heteroepitaxial 3C-SiC films. Various metals that have cubic crystal structures have been tried, such as molybdenum with and without a liquid metal intermediate layer. However, pure metals have problems with diffusion of the Si and C into the metal. The cubic metals that are potentially useful on the basis of their lattice dimensions are carbide-formers. Carbon diffuses into the metal surface and forms metal carbides; it is difficult to control Si:C stoichiometry during growth. Most high-melting metals have the body-centered cubic (bcc) structure; bcc metal substrates would lead to many APBs in the 3C-SiC overlay. Also, metal silicide formation can occur at the interface, preventing true epitaxy.

Therefore, to summarize the many problems with substrates:
no large single crystals
large lattice parameter mismatch
thermal expansion mismatch
defects in the substrate cause unsatisfactory surface morphology and crystal quality of resulting 3C-SiC overlay Larger scale devices require large area 3C-SiC epitaxial layers suitable for device or IC processing. These epitaxial layers must be able to be formed reproducibly, in single crystals having lateral dimensions greater than several square millimeters by a fabrication technique that does not adversely influence the key properties of the 3C-SiC overlayer, that is, its thermal stability, corrosion resistance, and desirable electrical properties.

Bunshah, Parsons and Stafsudd attempted to solve the substrate problem by using cubic TiC (or, alternatively, ZrC, WC, TaC or ScN) single crystals as substrates, most especially favoring TiC because: (1) TiC has a good lattice match to 3C-SiC (TiC has a lattice parameter of 4.33 Å compared to 4.36 Å for 3C-SiC, the lattice parameters thus differing by only 0.7% at ambient temperatures; (2) TiC has only one polymorph and no polytypes; (3) TiC and 3C-SiC have an acceptable coefficient of thermal expansion match, with TiC having a slightly larger thermal expansion. This larger thermal expansion is helpful, since it places the 3C-SiC film into slight compression upon cooldown after film growth, rendering formation of microcracks and pinholes less likely. In general, the surface morphology of thick (>1 μm) epilayers tends to be rough when the epilayers are tensionally loaded. If the TiC is of good quality, the resulting 3C-SiC crystals have a very low density of stacking faults and other crystalline defects.

Additionally, Ti is electrically inert in SiC. At the high temperatures of 3C-SiC growth (1200°-1600° C.), some interdiffusion can be expected to occur, but without deleterious electrical effects. If desired, interdiffusion of Ti into the SiC can be prevented by saturating the surface of the TiC with carbon immediately before SiC growth.

Any TiC crystallographic orientation will support heteroepitaxy of 3C-SiC. Growth on the <111> surface is preferred and off-axis slicing can improve lattice matching. TiC is a good electrical conductor with a work function of ~3eV, allowing for the possibility of fabricating novel devices such as permeable base transistors. TiC has higher thermal conductivity than SiC or Si, and thus thermal gradients are minimized and thermal energy dissipation is enhanced.

Despite these potentially significant advantages, serious problems are encountered in preparing single crystal TiC of adequate size and quality. Large area single crystals of TiC are unavailable, and this lack is hindering 3C-SiC device development.

Carbide single crystals are grown by float zone techniques because the materials melt at such high temperatures that it has not been possible to realize uncontaminated crystal growth by methods that require a container. Alternative methods that could potentially be used for TiC single crystal growth include other "crucible-less" techniques such as skull melting. The same problems and advantages as are confronted in float-zoning would apply to these methods.

The float zone process involves formation of a molten zone and subsequent movement of the zone along a feed rod which is made from pressed and sintered powders of the substance that one is trying to recrystallize. Float zoning has the advantage that no contamination from a crucible occurs. Large crystals may usually be prepared by this technique.

TiC single crystals are grown by float zone techniques because of the high melting point of TiC. Problems that hinder TiC crystal growth include the following:

(1) cracks are prone to form,
(2) subgrain boundaries are usually observed and these generate grain boundaries in the epitaxial 3C-SiC overlayer,
(3) pinholes form, creating pinholes in the SiC overlayer, and
(4) stacking faults and other dislocations are difficult to avoid in float zoned TiC. These defects create poor morphology and crystal imperfections in the epitaxial overlayer of 3C-SiC.

Several possible explanations for the problems encountered in growing TiC single crystals have been advanced. The molten zone is at a very high temperature because of the high melting point (3160° C.) of TiC; therefore enormous thermal stresses are present during growth. The stresses in the "cooldown" region near the molten zone are severe, from the molten temperature of >3000° C. down to about 1500° C. Below 1500°-800° C., cracking occurs. It is generally believed that below 800° C., dislocations do not move through the crystal. These thermal stresses cause dislocations and defects. It is difficult to heat a large feed rod uniformly, exacerbating the thermal stress problem that already exists with cooldown. It will be very hard indeed to heat a 2 inch diameter rod uniformly, and this is the size that must be targeted for economical device fabrication processes. Arcing is a problem in float zoning at high powers. In TiC float zone recrystallization, a very large amount of rf power is required; the growing crystal is blanketed with helium to prevent arcing, but the helium has a high thermal conductivity and carries enough heat away from the rod to significantly contribute to the thermal stress problem. TiC has a high vapor pressure at its melting point and can vaporize and coat the induction coils, increasing the likelihood of arcing.

Solid solutions of cubic carbides are known. A prominent characteristic of the cubic monocarbides is their extensive mutual solubility. In general, the cubic carbides are mutually soluble in all concentration ranges when the covalent radii of the metal atoms differ by less than 10%.

Hollox et al. (U.S. Pat. No. 3,661,599), in efforts to make high temperature structural materials, alloyed vanadium carbide into TiC. Feed rods were prepared by mixing TiC and VC powders in specified ratios and pressing and sintering the rods. A molten zone was passed through these prepared feed rods (a process referred to as "zone refining"). Previously, cubic carbide structural materials in powder mixtures had been sintered and did not form fully dense solids. These less than fully dense carbide solids thus were not optimally strong for the structural applications that Hollox et al. were targeting. U.S. Pat. No. 3,661,599 teaches alloying powders followed by zone refining to lead to fully dense, single phase materials, which had several advantages. The zone refined alloys were extremely strong, judged by compressive yield strength (CYS). Most significantly, the alloys were stronger than the pure materials. The alloy containing 25% TiC: 75% VC by weight was the strongest at high temperatures (>1200° C.), with the 50:50 alloy close behind. Above 1400° C., 75% TiC: 25% VC has CYS ½ of 25% TiC: 75% VC. The TiC and VC pure carbides have much lower CYS, which fell off markedly at temperatures above about 1200°-1400° C.

There are several possible rationalizations for the observation that the mixture may be much stronger than the single pure component. Dislocations travel through a mixed lattice less easily. Higher yield strength may imply less defect formation under the highest thermal stresses. It is worth noting that the CYS improvement was observed in the temperature regime where the thermal stresses are the greatest during float zone cooldown. The allows were easier to float zone than the pure carbides. Alloying decreased the number and size of cracks in the resulting crystalline boule. The carbide alloys formed by the process of U.S. Pat. No. 3,661,599 could be polycrystalline or single crystal, depending on the rate the molten zone was passed along the rod.

It is known that the dislocation density of semiconductor compounds of columns III-V and II-VI of the periodic chart can be reduced by proper introduction of alloying atoms into the compounds. In Sher U.S. Pat. No. 4,607,202 and Mooney et al. U.S. Pat. No. 4,568,795, it is taught that the dislocation density of III-V and II-VI semiconductor compounds can be reduced by alloying such semiconductors with isoelectronic impurity atoms forming bond lengths with the semiconductor atoms that are less than the bond lengths between atoms of the semiconductor. The alloying atoms can be added in relatively low amounts only, so that the solubility limit of the host semiconductor compound cannot be exceeded. This value is insufficient to eliminate dislocations totally.

Parsons and Stafsudd (International Patent Publication WO 89/06438) have described alloying of silicon carbide with one or more of the carbides of Ti, Hf, Zr, V, Ta, Mo, W, and Nb, with Ti, Hf, and Zr preferred. By selecting appropriate proportions of metal carbide and SiC, the alloy's bandgap may be tailored to any desired level between the bandgaps of the metal carbide and SiC. Semiconductor devices are formed by epitaxially growing a layer of the new alloy upon a latticematching substrate, preferably TiC. While retaining the benefits of single-bandgap 3C-SiC, the new alloys may enable various electrical devices that cannot be achieved with 3C-SiC, and also have a potential for bandfolded superlattices for infrared detectors and lasers. Solid solutions of 3C-SiC with aluminum nitride to modify the bandgap have been reported ("Synthesis and study of epitaxial layers of $(SiC)_{1-x}(AlN)_x$ wide-gap solid solutions, "Nurmagomedov, et al., Sov. Tech. Phys. Lett. 12(9), p. 431 (1987)) and show promise as materials for optoelectronics and acoustoelectronics. These solid solutions are thought to retain cubic crystal structure at very low AlN concentrations. The problems of substrate suitability and producibility that plague 3C-SiC device development will also hinder the development of devices based on the silicon carbide alloys and solid solutions. Hence, while the discussion herein refers to 3C-SiC, it will be appreciated that the same considerations and advantages of the present invention will apply to the SiC alloys and solid solutions as well.

It is an object of the present invention to provide a device wafer base of 3C-SiC overlaid upon a substrate which is a single crystal having dimensions greater than several mm so that arrays of devices can be processed and prepared thereon. Another object of the invention is to provide a method for fabricating the wafer base using alloys suitable to form the single crystal substrate. Another object of the invention is to provide a method for making single crystals suitable for serving as the substrates for 3C-SiC overlay to form a device wafer base. Other objects and advantages of the present invention will be more apparent from the ensuing disclosure and the appended claims.

SUMMARY OF THE INVENTION

The present invention relates in one aspect to electronic device wafer bases comprising epitaxial thin films of 3C-SiC on suitable substrates, useful for fabrication of semiconductor devices.

The substrates useful for 3C-SiC epitaxial overlay must have certain properties. The substrate must be readily fabricated as relatively large single crystals, preferably as boules with dimensions of at least 0.5 inches and preferably approximately 2 inches in diameter or larger. The substrate must have a surface suitable for epitaxial deposition of 3C-SiC. The surface must not adversely influence the desirable properties of the SiC overlay by manifesting any defects or inhomogeneities that would be carried forward into the 3C-SiC epitaxial layer. The crystal structure of the substrate must be compatible with the cubic crystal structure of 3C-SiC. In this regard, substrates having the face-centered cubic (fcc) crystal structure are particularly useful. The crystalline lattice of the substrate must have a good lattice match to 3C-SiC. Thermal stability of the substrate at the 3C-SiC growth temperatures is required. The thermal expansion of the substrate must be relatively close to that of 3C-SiC. The substrate may be prepared by known techniques such as float zone crystallization. The 3C-SiC epitaxial overlay upon the crystal substrate to form the device wafer base may be fabricated by known techniques such as chemical vapor deposition, reactive evaporation, or liquid phase epitaxy.

The substrate upon which the epitaxial layer of 3C-SiC is deposited comprises an element or compound capable of single crystal growth in adequate size for useful device fabrication processes, at least 0.5 inches and preferably about 2 inches or larger in diameter, as crystal rods for lateral slicing. The substrate is preferably a metal carbide alloy having a cubic crystal structure. Alloys of transition metal carbides, with any non-cubic component present in concentrations sufficiently low that the alloy retains a cubic crystal structure, are particularly well-suited for the present invention. Metal carbides useful in the present invention are WC, VC, MoC, TiC, TaC, HfC, NbC, and ZrC, with alloys containing two or more of VC, TiC, TaC, and NbC being especially preferred. VC/TiC alloys with VC mole percent ranging from 5–90% and NbC/VC alloys, with the alloy having a 2:1 mole ratio of NbC:VC, are especially preferred because of their good lattice parameter match to 3C-SiC and increased ease of float zone recrystallization. Alloys which include WC or MoC, which form a hexagonal crystal structure in their pure state, may be used when the concentration of WC or MoC is lower than about 10–20%. These carbides may be dissolved into fcc carbides up to about 10–20% without disrupting the cubic structure. All percentages referred to herein are mole percents.

The semiconductor device base comprises a suitable substrate and a 3C-SiC overlay epitaxially related to the substrate, said overlay being unpolytyped, single crystal, uncracked, free from twins, and possessing integrated circuit quality surface morphology. Methods of preparing the epitaxial overlay include reactive evaporation, chemical vapor deposition, and liquid phase epitaxy, with the chemical vapor deposition method taught in U.S. Pat. No. 4,923,716 being especially useful. Both substrate and 3C-SiC overlay may be doped to achieve regions of different electronic properties. Doping can be accomplished by known methods such as ion implantation or in-situ doping. The epitaxial relation to the substrate may be direct or indirect. As used herein, the term "epitaxially related to the substrate" includes the use of interlayers which facilitate a close lattice match between the substrate and the overlayer; "directly epitaxially related to the substrate" connotes no interlayer.

Devices may be fabricated into the silicon carbide by using epitaxial growth and dry etch techniques. Use of the device wafer base and process of the present invention permits the development of SiC device technology, which has significant advantages at high temperatures, in corrosive environments, in the presence of radiation, and for high power, high frequency devices. The device wafer base will permit fabrication of devices using simple modifications of well-known silicon fabrication techniques.

DETAILED DESCRIPTION OF THE INVENTION

Figure 1:
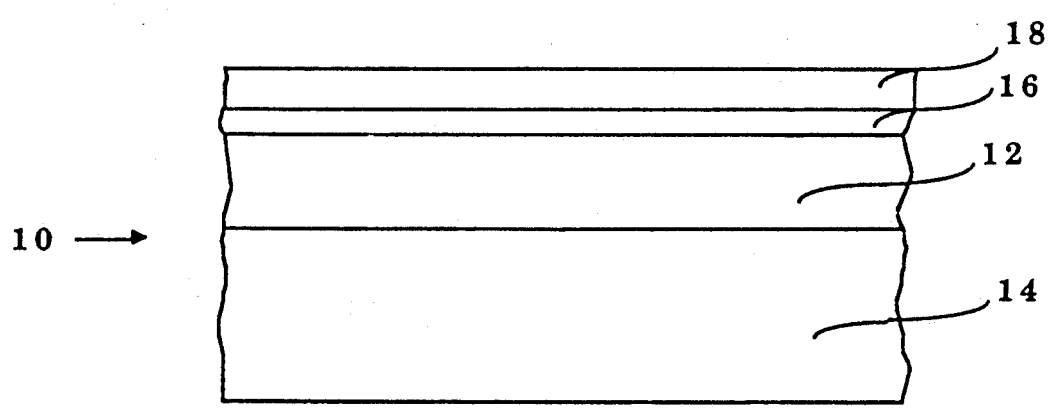
FIG. 1 shows a semiconductor device wafer base having a silicon carbide overlay layer epitaxially related to a cubic carbide substrate.

3C-SiC inherently possesses many of the characteristics most desirable in a high temperature semiconductor material. It has a large bandgap, high breakdown voltage, excellent thermal conductivity, and may be doped by the same species that are used to dope silicon, to achieve similar results. It is chemically stable as the cubic polytype up to about 2000° C., as compared with silicon, which has a melting point of about 1420° C. 3C-SiC is highly resistant to diffusion of foreign atoms and is chemically inert to many reactants which can severely attack silicon and other common semiconductor materials. Ohmic contacts may be readily made to 3C-SiC by techniques well known in the field of silicon semiconductor technology, as by the method taught in U.S. Pat. No. 4,738,937, "Method of Making Ohmic Contact Structure." FIG. 1 illustrates the type of deposited structure that may be formed with the process of the invention. A semiconductor device wafer base 10 has a 3C-silicon carbide overlay layer 12 epitaxially deposited upon a substrate 14. The substrate 14 may be any of the single crystal alloys described in detail below. The illustrated wafer base 10 is not itself a semiconductor device, but is typically further processed to form useful semiconductor devices thereon. The present invention is preferably employed to deposit layers of silicon carbide, but also may be used to form free standing silicon carbide structures.

By way of illustration of possible approaches, a second overlay layer 16 and a third overlay layer 18 may optionally be deposited overlying the silicon carbide overlay layer 12. The second overlay layer 16 might be, for example, a layer of silicon carbide doped to be p-type or n-type. The third overlay layer 18 might be, for example, another layer of 3C-silicon carbide or another doped layer. Such layered structures can be developed by simply altering the composition of the gas flow to the deposition apparatus.

Silicon carbide may exist in numerous polytypes, and interconversion between these polytypes can present problems for electronic device fabrication. Crystallographic changes between polytypes during heating or cooling result in variable bandgaps, transformational strains, and the formation of defect structures, e.g. twins. Therefore polytype stability is required for use in electronic devices. 3C-SiC cubic has only one polytype and is more stable than the alpha polytypes. The presence of small amounts of alpha polytypes adversely affects 3C-SiC semiconductor performance. Therefore, the techniques by which silicon carbide devices are fabricated and used must ensure that polytype stability is achieved, most preferably the 3C-SiC cubic polytype.

For the present invention, the requirements for a suitable substrate are:

(1) The substrate must possess a cubic crystal structure, with lattice parameter within about 5% and preferably within 1% of that of 3C-SiC at ambient temperatures.

(2) The substrate must undergo no significant phase, polytype or crystallographic transformations from ambient temperature to above about 1500° C. Thus the substrate must have a high melting or dissociation temperature, above about 1500° C.

(3) The substrate must have high thermal conductivity, adequate to provide a good thermal sink for extraction of heat from the 3C-SiC layer during device operation.

(4) The substrate must be chemically inert to high temperatures, 1500° C. or higher.

(5) The substrate should have a coefficient of thermal expansion equal to or greater than that of 3C-SiC, thus allowing the overlay to be fabricated at relatively high temperature and cooled with the overlay in mild lateral compression at ambient temperature. Compression is thought to prevent the formation of microcracks.

(6) The substrate constituents must be congruently melting, or serious difficulties will be encountered in efforts to fabricate it as a single crystal. If the material is not congruently melting, composition or crystallographic fluctuations are likely to result upon recrystallization.

(7) Finally, the substrate must be capable of fabrication in sufficiently large single crystals such that a laterally extensive 3C-SiC overlay layer is possible.

The use of titanium carbide went a long way toward addressing the first six criteria listed above. The last criterion has proven the most difficult to fulfill. We have now found that alloying the cubic transition metal carbides enables growth of large single crystals that are very suitable for use as 3C-SiC substrates. The alloys may be fabricated as large single crystals, in contrast to previously used substrates such as pure TiC, which has proven very difficult to prepare as a single crystal without cracks, pinholes or dislocations. To date, it has been impossible to prepare pure TiC single crystals of 0.5 inch diameter without defects, dislocations, cracks, or pinholes, and for economical device fabrication processes, diameters of about 2 inches must be achieved.

It is an object of the present invention to provide single crystal substrates that can be produced in large diameters without defects, dislocations, cracks, or pinholes. Solid solutions of transition metal carbides have been long known. The transition metal carbides are mutually soluble in all concentration ranges. Transition metal carbide alloys melt higher at higher temperatures than does silicon carbide and have a more negative free energy of formation. Therefore they are expected to be more stable in every temperature range. Congruent melting is expected in the composition range of metal:- carbon of 0.8–1.0. Thermal conductivity may be closely matched. Lattice parameter mismatch may be small. In the cubic carbides, the lattice parameter is a linear function of mole percent composition. Therefore, the lattice parameter can be "engineered." The cubic crystal structure is retained, even upon alloying with hexagonal carbides, provided the hexagonal carbide is present in concentration below about 10–20%. The carbides which are useful for forming alloys in this invention and properties which are relevant to the device wafer base application are tabulated below (values were taken from "Refractory Materials," CRC Handbook of Chemistry and Physics, 63rd Edition, and Ullmann's Encyclopedia of Industrial Chemistry, Fifth Edition, VCH, Wernheim, Germany, 1986).

| | Suitable Metal Carbides | | |
|---|---|---|---|
| carbide | crystal form | lattice constant (Å) | melting point(°C.) |
| WC | hexagonal | | 2630 |
| VC | cubic | 4.165 | 2830 |
| MoC | cubic or hexagonal* | 4.28 | 2695 |
| TiC | cubic | 4.33 | 3160 |
| 3C-SiC | cubic | 4.359 | 2100 |
| TaC | cubic | 4.455 | 3880 |
| HfC | cubic | 4.468 | 3890 |
| NbC | cubic | 4.461 | 3500 |
| ZrC | cubic | 4.698 | 3030 |

*three hexagonal and one cubic polymorph exist

The benefits of alloying the transition metal carbides before preparing the single crystal substrate are many. Disclocations do not travel through a mixed lattice as easily as through a pure crystal. Compressive yield strengths of the alloys are higher, as taught by Hollox et al. in U.S. Pat. No. 3,661,599. Thus the alloys are better able to withstand the high stresses inherent in the float zone recrystallization process without cracking. In some cases, alloying enables crystal growth at lower temperatures than with pure TiC, which makes processing easier.

Suitable alloy species for the present invention include alloys of two or more of TiC, VC, NbC, TaC, ZrC, HfC, WC, and MoC. Alloys of VC and TiC can be prepared which have high compressive yield strength and close lattice match to 3C-SiC. The TiC melting point is 3160° C.; the VC melting point is 2830° C. Therefore the alloy can be float zone recrystallized at lower temperature than pure titanium carbide. A niobium carbide:vanadium carbide alloy in a mixture of 2:1 NbC:VC mole ratio would have exact lattice match to 3C-SiC. However, its melting point would be higher. A quaternary alloy with TiC having composition $x(TiC)+(1-x)(2NbC:VC)$ has lower melting point. This alloy would retain an excellent lattice and thermal expansion match to 3C-SiC and have all the advantages of ease of float zone recrystallization.

WC or MoC form hexagonal crystal structures in their pure states. These carbides may be dissolved into cubic carbides up to about 10–20% without disrupting the cubic structure. Examples of suitable alloys include WC/TiC alloys, TaC/WC/TiC quaternary alloys, MoC/TiC/NbC (a composition having 0.1:0.72:0.18 mole ratio would have an exact lattice match to 3C-SiC).

Single crystal substrates and epitaxial overlays may be prepared by known techniques. The single crystal crystal substrates may be prepared by float zone recrystallization. The epitaxial 3C-SiC overlay can be grown by known methods such as chemical vapor deposition or reactive evaporation.

Figure 2:
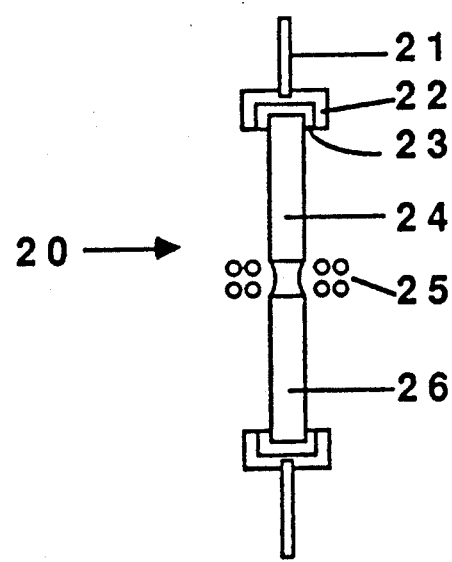
FIG. 2 shows a schematic representation of a float zone crystallization apparatus used for substrate preparation.

High pressure float zone crystal growth has historically been the method of choice for producing single crystals of the transition metal carbides because of their high melting temperatures. Float zone crystal growth involves passing a molten zone vertically through a polycrystalline preform. If the molten zone moves at an appropriate rate, a single crystal solidifies behind the molten zone. FIG. 2 shows an apparatus 20 for float zone recrystallization. The stainless steel shaft 21 is affixed to a holder 22, usually constructed of molybdenum, with a boron nitride liner 23. The feed rod 24 is encircled by and passes through the induction coil 25, which heats the feed rod to its melting point. The molten zone of the feed rod solidifies as a single crystal 26 as it passes out of the induction coil area.

For growth of metal carbide alloy single crystals, the preform is prepared from a metal carbide powder mixture of defined composition. The carbon content is adjusted to the range of atomic ratio of 1.2:1 to 1:1 in order to be within the single phase region (which can be approached from either the metal-rich or carbon-rich side). The average diameter of the powder grains is typically 1.0–5.0 microns. The preform is hot pressed. The hot pressing temperature is typically 1900°–2200° C. Alternatively, the preform may be isostatically pressed followed by a sintering step. The melt is formed by induction heating, and the process is conducted under several hundred psi of helium because titanium carbide has a high vapor pressure at its melting point. The parameters that are adjusted for optimal float zone growth are growth rate (rate at which the molten zone moves along the rod, gas cover, seed crystal rotation rate, rod rotation rate, and ingot diameter. The parameters for a typical metal carbide float zone recrystallization are as follows:

Growth Rate: 0.25 inch/hr.
Gas Cover: 600 psi He.
Seed Rotation: 3 rpm counterclockwise.
Rod Rotation: 4 rpm clockwise.
Ingot Diameter: 0.75 inch.

Figure 3:
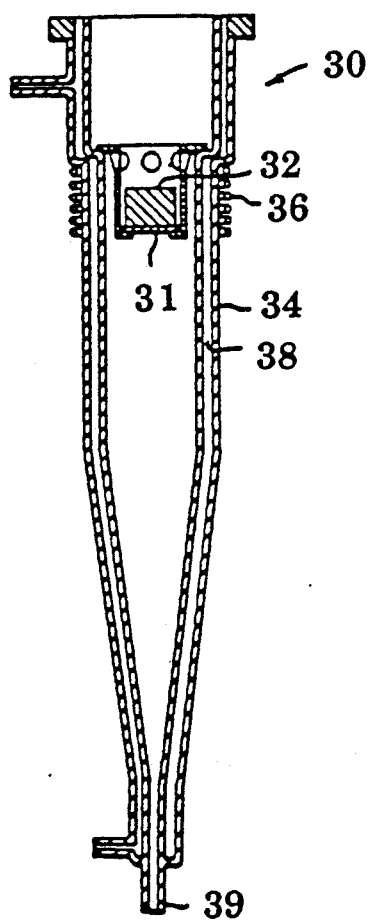
FIG. 3 shows a chemical vapor deposition apparatus for depositing the SiC overlayer.

The epitaxial thin film of 3C-SiC may be deposited onto the prepared substrate by chemical vapor deposition as described in U.S. Pat. No. 4,923,716 (Parsons & Brown, 1990). The silicon carbide layer 12 shown in FIG. 1 is deposited upon the substrate by chemical vapor deposition (CVD). A preferred apparatus 30 for accomplishing the CVD is illustrated in FIG. 3. In the apparatus 30, the substrate 14 is attached to a graphite susceptor 32. The susceptor and attached substrate are placed into a chamber 34 within an RF (radio frequency) heater coil 36, whereby the substrate 31 is heated to the deposition temperature as the susceptor is heated. The chamber 34 is of a vertical double walled construction, and in operation cooling water is passed through the outer jacket 38. The reactive source gas is introduced through a port 39 at the lower end of the chamber 34 and contacted with the substrate 14, so that a silicon carbide overlay layer 12 is epitaxially deposited upon the substrate 14 as a result of the pyrolysis of the source gas at the surface of the heated substrate. As taught by U.S. Pat. No. 4,923,716, the preferred reactive gases are 1,2-disilylethane (also sometimes known as 1,2-bis(silyl)ethane), disilylethene, disilylethyne, a silacycloalkane of the formula $(SiH_2CH_2)_p$, where p is 2, 3, 4, or 5, and a cyclic structure of the formula $(CH_3SiH)_q$, where q is 4 or 5. Disilylethane has a chemical formula of $H_3SiCH_2CH_2SiH_3$. Disilylethyne has a chemical formula of $H_3SiC=CSiH_3$. Of these preferred source materials, 1,2-disilylethane is the most preferred. Alternatively, a silicon-containing gas such as silane and a carbon-containing gas may be reacted together over the substrate, but with separate sources of Si and C, the stoichiometry of the 3C-SiC film is more difficult to control. Halogen-containing source reagents can been used for CVD of 3C-SiC in the practice of the invention, with methyltrichlorosilane being especially useful among these.

The epitaxial thin film of 3C-SiC may alternatively be deposited onto the prepared substrate by reactive evaporation, for example as described in U.S. Pat. No. 4,767,666 (Bunshah et al. 1988). Reactive deposition at a temperature of greater than about 1250° C., and preferably above about 1325° C., may be used to epitaxially deposit the 3C-SiC overlay onto the substrate. In such a process, the substrate is placed into a vacuum chamber and pumped down, and then a flow of carbon-containing gas is established over the substrate. Silicon is evaporated from a source within the chamber, so that the evaporated silicon atoms pass through the carbon-containing gas and react therewith, and the resulting reaction products are deposited as an epitaxial layer on the substrate. The preferred carbon-containing gas is acetylene, although other carbon-containing gases may be employed.

Liquid phase epitaxy is yet another technique which can be used in the practice of this invention to deposit the epitaxial thin film of 3C-SiC as taught in U.S. Pat. No. 4,614,672, "Liquid Phase Epitaxy (LPE) of Silicon Carbide." In this technique, the substrate is placed in a molten bath of Si saturated with SiC at a temperature of between 1600° C. and 1800° C. and 3C-SiC is deposited by reducing the temperature of the substrate to a temperature 20°–50° C. less than the molten Si.

It may be possible in the broad practice of the invention to use other materials with cubic crystal structure as the epitaxial overlay. Other materials with cubic crystal structure that might advantageously be used as the epitaxial overlay include boron phosphide (lattice constant 4.53Å) and zinc oxide (lattice constant 4.58Å).

EXAMPLES

EXAMPLE 1. PREPARATION OF 5% VC/95% TIC ALLOY SINGLE CRYSTAL SUBSTRATE

Vanadium carbide, vanadium, titanium carbide, and titanium powders with a particle size of 1 to 10 microns are blended together in the following proportions:
VC: 481 gms.
V: 43 gms.
TiC: 8702 gms.
Ti: 773 gms:
The blended powders are placed in a graphite die to be hot pressed into a rectangular plate with one dimension of the rectangle equal to the length of the desired carbide preform, typically 6 inches. Sufficient powder is added to the die to produce a plate whose width is that of the desired substrate diameter, in this case 0.75 inches. The powder is hot pressed at approximately 2000° C. with a pressure of approximately 1700 psi for approximately 30 to 60 minutes. The pressing is performed under argon gas. A plate having a uniform density of greater than or equal to 95% of theoretical density is produced.

The hot-pressed plate is sliced into bars with a square cross section having dimensions of 0.75 inches×0.75 inches×6.0 inches. Using diamond tooling, the bars are centerless ground into cylindrical rods having a diameter of 0.5 inches and a length of 6.0 inches. These rods will be used as float zone preforms.

To produce a single crystal ingot, a rod is mounted vertically in a float zone crystal growing apparatus. Each end of the rod is held by a grip which is capable of rotation and vertical translation. The grips are composed of molybdenum lined with boron nitride. The molybdenum is attached to a water-cooled stainless steel shaft. A double pancake induction coil composed of two sets of two coplanar loops is positioned around the bottom end of the preform rod, but at least one inch away from the grip. The coil has an internal diameter of 0.75 inches, an outside diameter of 1.75 inches, and a height of 0.600 inches. The coil is fabricated from 0.1875 inch diameter copper tubing. Water at a pressure of 160 psi is flowed through the coil during the float zone operation to keep the coil cool.

The assembly is positioned in a chamber containing 600 psi of pure helium. A molten zone is created in the preform rod by the application of approximately 50 KW of radio frequency power with a frequency of 400 KHz. The height of the molten zone is typically 0.5 inches. The diameter of the molten zone is typically 0.4 inches. Once the molten zone is established, the top grip is rotated clockwise and the bottom grip is rotated counterclockwise. Both grips are also moved downward at a speed of 0.25 inches per hour. This process is continued until an ingot of 2.5 inches in length is created. The grips are then stopped, and power is reduced gradually over a period of several hours.

The resulting single crystal ingot is then oriented by X-ray diffraction to facilitate the slicing of wafers with a known crystallographic orientation. The <111> orientation is preferred for 3C-SiC epigrowth. An ID diamond wafering saw is typically used for slicing. Wafers having a thickness of 0.5 to 1.0 mm are preferred.

The wafers are polished using a standard lapping wheel. Diamond pastes are used for rough polishing. The final polish is accomplished through the use of a mixture of 15.0 gms potassium ferricyanide, 2.0 gms potassium hydroxide, 50 gms 0.05 micron alumina powder, and 450 ml of distilled water. This material has a lattice parameter of roughly 4.32 Å and has the face centered cubic crystal structure.

EXAMPLE 2. PREPARATION OF 50% VC/TIC ALLOY SUBSTRATE

The same process is used as in Example 1, with the exception that the composition of the powder blend was as follows:
VC: 4704 gms.
V: 423 gms.
TiC: 4476 gms.
Ti: 398 gms.
This material has a lattice parameter of 4.25 Å and has the face centered cubic crystal structure.

EXAMPLE 3. PREPARATION OF NBC/VC/TIC ALLOY SUBSTRATE

The same process is used as in Example 1, with the exception that the composition of the powder blend was as follows:
VC: 1556 gms.
V: 140 gms.
TiC: 3702 gms.
Ti: 329 gms.
NbC: 3890 gms.
Nb: 383 gms.
This material has a lattice parameter of 4.34 Å and has the face centered cubic crystal structure.

EXAMPLE 4. PPEPARATION OF TAC/VC ALLOY SUBSTRATE

The same process is used as in Example 1, with the exception that the composition of the powder blend was as follows:
TaC: 7456 gms.
Ta: 777 gms.
VC: 1622 gms.
V: 146 gms.
This material has a lattice parameter of 4.34 Å and has the face centered cubic crystal structure.

EXAMPLE 5. DEPOSITION OF 3C-SIC ONTO 5% VC/TIC SUBSTRATE

The apparatus of FIG. 3 was used to deposit undoped 3C-silicon carbide upon the <001> surface of a substrate having composition 5% vanadium carbide: 95% titanium carbide. The temperature of the substrate was varied between 1200° C. and 1500° C., without a noticeable effect upon deposition. Hydrogen carrier gas was bubbled through liquid 1,2-disilylethane maintained at 0° C. The total gas pressure was 1 atmosphere, and the flow rate of the hydrogen was varied from 1 to 10 sccm. Diluent hydrogen gas was also introduced along with the hydrogen bubbled through the bubbler to collect 1,2-disilylethane, for a total gas flow of about 2900 sccm. 3C-Silicon carbide was deposited over the entire range of flow rate and temperature. The growth rate of the silicon carbide was linearly related to the flow rate of hydrogen through the bubbler over the range studied. The 3C-silicon carbide growth rate was about 0.6 micrometers per hour, for each sccm of hydrogen flow through the bubbler. The undoped 3C-silicon carbide was measured to have an n-type carrier concentration of about $5 \times 10^{16}$ per cubic centimeter. This concentration is believed to be due to background nitrogen donors.

EXAMPLE 6. DEPOSITION OF 3C-SIC ONTO 50% VC/TIC SUBSTRATE

The method of Example 5 was used to deposit undoped 3C-silicon carbide upon a (001) substrate having composition 5% vanadium carbide: 95% titanium carbide.

EXAMPLE 7. DEPOSITION OF P-DOPED 3C-SIC ONTO 50% VC/TIC SUBSTRATE 3C-silicon carbide with p-type doping was prepared using the same approach as described in Example 5, except that a dopant source gas was mixed with the silicon carbide source gas and diluent gas. In this example, the hydrogen flow through the 1,2-disilylethane silicon carbide source liquid was 10 sccm. A separate hydrogen flow of 1 sccm was bubbled through liquid trimethylaluminum maintained at 20° C., so that trimethylaluminum vapor was transferred to the deposition chamber along with the 1,2-disilylethane and the carrier gas. Aluminum was deposited in the 3C-silicon carbide as a dopant. The total gas flow was maintained at about 2900 sccm.

The dopant level was linearly related to the gas flows. For example, a doubling of the flow rate of hydrogen through the dopant source material, while maintaining constant the flow rate through the silicon carbide source, doubles the concentration of dopant in the 3C-silicon carbide. Doubling of the flow rate of hydrogen through the silicon carbide source bubbler, while maintaining the flow rate of hydrogen through the dopant source material bubbler, results in a halving of the concentration of the dopant. The doped silicon carbide material was measured to have a p-type carrier concentration of about $2 \times 10^{19}$ per cubic centimeter.

EXAMPLE 8. DEPOSITION OF N-DOPED 3C-SIC ONTO 50% VC/TIC SUBSTRATE 3C-silicon carbide with n-type doping was prepared using the same approach as described in Example 5, except that a dopant source gas was mixed with the silicon carbide source gas and diluent gas. In this example, the hydrogen flow through the 1,2-disilylethane silicon carbide source liquid was 5 sccm. A separate dopant flow of 10 sccm hydrogen containing 46 ppm (parts per million) of $NH_3$ was mixed into the gas flow, so that nitrogen was transferred to the deposition chamber. Nitrogen was deposited in the 3C-silicon carbide as a dopant. The total gas flow was maintained at about 2900 sccm. The linear doping characteristics are found for this dopant, also. The n-type carrier concentration of the doped 3C-silicon carbide was found to be about $1 \times 10^{18}$ per cubic centimeter.

The device wafer base and process of the present invention offer many functionally significant advantages. Proper selection of substrate material offers the capability of forming epitaxial overlayers of 3C-SiC of lateral size adequate for processing arrays of devices. The 3C-SiC may be prepared substantially free of defects. The resulting device wafer base is chemically and physically stable and incorporates the many advantages of 3C-SiC enumerated above. Various modifications are possible within the spirit and scope of the present invention.

What is claimed is:
1. A semiconductor wafer base comprising:
   a single crystal substrate having cubic crystal structure, said substrate comprising a material selected from the group consisting of alloys of two or more of TiC, VC, NbC, TaC, ZrC, HfC, WC, and MoC; and
   an unpolytyped, single crystal 3C-SiC overlay epitaxially related to said substrate.
2. The wafer base of claim 1, wherein the thickness of said overlay is about 0.05 to 100 micrometers.
3. A semiconductor wafer base comprising:
   a single crystal substrate having cubic crystal structure, said substrate comprising an alloy of TiC and VC with VC mole % ranging from 5-90%; and
   an unpolytyped, single crystal 3C-SiC overlay epitaxially related to said substrate.
4. A semiconductor wafer base comprising:
   a single crystal substrate having cubic crystal structure, said substrate being selected from the group consisting of alloys of two or more of TiC, VC, NbC, TaC, ZrC, HfC, WC, and MoC; and
   an unpolytyped, single crystal overlay epitaxially related to said substrate, said overlay layer having a cubic crystal structure and comprising an alloy of SiC and one or more of TiC, HfC, ZrC, VC, TaC, MoC, WC, NbC, and AlN.
5. A semiconductor wafer base comprising:
   a single crystal substrate having cubic crystal structure, said substrate comprising a material selected from the group consisting of alloys of two or more of TiC, VC, NbC, TaC, ZrC, HfC, WC, and MoC; and
   an unpolytyped, single crystal 3C-SiC overlay epitaxially related to said substrate, wherein the overlay is doped.
6. A semiconductor wafer base comprising: a single crystal substrate having cubic crystal structure; and an unpolytyped, single crystal 3C-SiC overlay epitaxially related to said substrate, wherein the single crystal substrate comprises an alloy of two or more of TiC, NbC, TaC and VC, having a lattice parameter of from 4.25 to 4.45 Å.
7. A semiconductor wafer base comprising:
   a single crystal substrate having cubic crystal structure; and
   an unpolytyped, single crystal 3C-SiC overlay epitaxially related to said substrate, wherein the single crystal substrate comprises an alloy of TiC and WC, with WC content ranging from 2 to 10 mole %.
8. A semiconductor wafer base comprising:
   a substantially defect-free single crystal substrate at least 0.5 inches in diameter having cubic crystal structure, said substrate comprising a material selected from the group consisting of alloys of two or more of TiC, VC, NbC, TaC, ZrC, HfC, WC, and MoC; and
   an unpolytyped, single crystal 3C-SiC overlay epitaxially related to said substrate.
9. The wafer base of claim 8, wherein the substrate has a diameter of at least 2 inches.

* * * * *